(12) United States Patent
Berghofer et al.

(10) Patent No.: US 7,476,800 B2
(45) Date of Patent: Jan. 13, 2009

(54) ELECTRIC CONNECTION ELEMENT

(75) Inventors: Peter Berghofer, Müllendorf (AT); Josef Sugetich, Trausdorf (AT); Mathias Pedevilla, Vienna (AT)

(73) Assignee: Outokumpu Copper Neumayer GmbH, Leobersdorf (AT)

( * ) Notice: Subject to any disclaimer, the term of this patent is extended or adjusted under 35 U.S.C. 154(b) by 0 days.

(21) Appl. No.: 11/420,954

(22) Filed: May 30, 2006

(65) Prior Publication Data

US 2006/0272844 A1    Dec. 7, 2006

Related U.S. Application Data

(60) Provisional application No. 60/686,184, filed on Jun. 1, 2005.

(30) Foreign Application Priority Data

Jun. 1, 2005  (AT)  ................................ A 940/2005

(51) Int. Cl.
    *H01B 7/00*  (2006.01)
(52) U.S. Cl. ........................ 174/36; 174/115
(58) Field of Classification Search ................ 174/36, 174/112, 115, 126.1, 126.3, 129 R, 117 R
    See application file for complete search history.

(56) References Cited

U.S. PATENT DOCUMENTS

| | | | | | |
|---|---|---|---|---|---|
| 290,769 | A | * | 12/1883 | Gray | .................. 174/133 R |
| 543,960 | A | * | 8/1895 | Gray | .................. 174/133 R |
| 1,738,828 | A | * | 12/1929 | Jackson | .................. 174/36 |
| 3,522,577 | A | | 8/1970 | Zak | |
| 4,076,356 | A | * | 2/1978 | Tamburro | .................. 439/426 |
| 4,446,505 | A | * | 5/1984 | Long et al. | .................. 361/785 |
| 4,562,637 | A | | 1/1986 | Kushima et al. | |
| 4,628,598 | A | * | 12/1986 | Taylor | .................. 29/846 |
| 4,753,617 | A | * | 6/1988 | Jacobs | .................. 439/825 |
| 4,780,958 | A | * | 11/1988 | Shaffer | .................. 29/874 |
| 5,172,473 | A | * | 12/1992 | Burns et al. | .................. 29/885 |
| 5,696,352 | A | * | 12/1997 | Sourimsky | .................. 174/126.3 |
| 5,889,657 | A | * | 3/1999 | Kono | .................. 361/773 |
| 6,967,289 | B2 | * | 11/2005 | Goto | .................. 174/129 R |

FOREIGN PATENT DOCUMENTS

| | | | |
|---|---|---|---|
| DE | 103 48 542 A1 | | 6/2004 |
| GB | 1 568 464 A | * | 4/1980 |
| GB | 1 568 464 A | | 5/1980 |
| JP | 9-293754 A | | 11/1997 |
| JP | 2005-116486 A | | 4/2005 |

* cited by examiner

*Primary Examiner*—William H Mayo, III
(74) *Attorney, Agent, or Firm*—Henry M. Feiereisen; Ursula B. Day

(57) ABSTRACT

An electric connection element includes an electric conductor having a surface configured, at least in regions thereof, with a structuring and/or rough surface, and an electrically conductive coating.

28 Claims, 2 Drawing Sheets

ELECTRIC CONNECTION ELEMENT

CROSS-REFERENCES TO RELATED APPLICATIONS

This application claims the benefit of prior filed U.S. provisional Application No. 60/686,184, filed Jun. 1, 2005, pursuant to 35 U.S.C. 119(e), the content of which is incorporated herein by reference.

This application also claims the priority of Austrian Patent Application, Serial No. A 940/2005, filed Jun. 1, 2005 pursuant to 35 U.S.C. 119(a)-(d), the content of which is incorporated herein by reference.

BACKGROUND OF THE INVENTION

The present invention relates, in general, to an electric connection element for connecting electric components.

Connection elements of a type involved here have been used to electrically interconnect several electric components, e.g. solar cells, and are constructed in the form of a flat wire as electric conductor which has a coating of solder material. As the connection element is heated to melt the coating, it is soldered with the electric component. Coated connection elements designed as punched parts or cut bands have also been known.

Common to all conventional connection elements is the drawback that the attainable adhesive force by which the connection element is attached to the electric component is oftentimes insufficient. Moreover, a significant layer thickness of the solder is required, thereby increasing the costs for the coating. In addition, conventional connection elements, including those configured as flat wire, have a coating that normally has a convex surface configuration.

It would therefore be desirable and advantageous to provide an improved connection element which obviates prior art shortcomings and which is able to realize a high adhesive force, while requiring only little coating thickness.

SUMMARY OF THE INVENTION

According to one aspect of the present invention, an electric connection element includes an electric conductor having a surface configured, at least in regions thereof, with a surface enlargement, and an electrically conductive coating applied on the electric conductor.

The enlargement may hereby be realized by pattering or structuring the surface of the coating and/or roughening the surface of the coating. The terms "pattering" and "structuring" are hereby used interchangeably to refer to a modification of the surface. In the following description, the term "structuring" is used only for the sake of simplicity.

The present invention resolves prior art problems by enlarging the surface area of the electric conductor to effect an enlarged contact area between electric conductor and coating material so that the attainable adhesive force is increased. At the same time, a predefined adhesive force can be realized which reduces the layer thickness of the coating.

According to another feature of the present invention, the electrically conductive coating may contain a solderable material, for example a solder, such as tin. As a consequence, the coating itself can ensure the implementation of a firmly adhering soldered connection in one process step.

According to another feature of the present invention, the electrically conductive coating may contain an adhesive, e.g. a conductive adhesive. In this way, the coating may effect the implementation of a firmly adhering adhesive bond.

According to another feature of the present invention, the electric conductor may be made of metal, such as copper, or metal alloy, such as a copper alloy. This realizes an especially high electric conductivity as well easy handling capability.

According to another feature of the present invention, the structuring and/or rough surface may include a knurling or fluting. Such a surface modification can for example be made especially easily and automatically through rolling.

According to another feature of the present invention, the structuring and/or rough surface may be made through grinding. In this way, adhesive properties can be realized which are independent on the treatment direction and is thus the same within the contact surface in all directions According to another feature of the present invention, the structuring and/or rough surface may be made through etching. This chemical treatment also allows realization of an even surface modification.

According to another feature of the present invention, the structuring and/or rough surface may extend in cross section only across a region of the electric conductor that is intended for contacting. Thus, it is not required to treat the entire surface of the electric conductor. Only the one surface region has to be modified which, when the connection element is attached onto the electric component, is later brought into contact later with the latter.

According to another feature of the present invention, the structuring and/or rough surface may extend in cross section over the entire circumference of the electric conductor. When using the connection element according to the invention, this configuration does not require consideration as to which part of the electric conductor should be provided with a modified surface. The process steps are simplified accordingly.

According to another feature of the present invention, the electric conductor may be made from a punched part or a cut band. As a result, the connection element is especially easy to make and is cost-efficient.

According to another feature of the present invention, the electric conductor may have a length dimension which is greater than a cross section thereof and may be configured in the form of a wire for example. In this way, it is possible to interconnect many electric components by a connection element in one process step.

According to another feature of the present invention, a knurling or fluting may extend in substantial parallel relationship to the length dimension of the electric conductor. This has the advantage that the fluting or knurling can easily be applied continuously during production of the connection element. Moreover, it is especially advantageous that a surface is realized which is uniform across the length dimension and an even bonding is thus attained on the electric component.

According to another feature of the present invention, a grinding direction may extend in substantial parallel relationship to the length dimension of the electric conductor. Also in this case, the surface treatment can be carried out easily in a continuous process. Thus, a surface can be realized which is also uniform across the length dimension and an even bonding is thus attained on the electric component.

According to another feature of the present invention, the electric conductor can be circular in cross section. This allows the use of commercial wires.

According to another feature of the present invention, the electric conductor may have a configuration which deviates from a circular shape in cross section, for example a rectangular shape, and may be designed as flat wire. As a consequence of the greater contact surface, an especially good bond of the connection element upon the electric component can be realized.

According to another feature of the present invention, the surface of the coating may be provided over the entire length of the connection element with a structuring and/or rough surface. This allows an especially good bond as well as an especially simple production and handling. The structuring and/or rough surface can be applied continuously during production while ensuring a connection of high adhesive force at each area.

According to another feature of the present invention, the coating may extend over the entire length of the connection element. It is hereby of advantage that there is no need during fabrication to take into account the areas where the coating is located, and moreover a surface protection for the electric conductor is realized.

According to another aspect of the present invention, the connection element may be applied on a solar cell. The implementation of a reliable connection between solar cell and electric conductor is especially important, when used in this way, so that the application of a structuring and/or rough surface in accordance with the invention is of particular advantage.

According to another feature of the present invention, at least two solar cells may be interconnected by a connection element according to the invention. Connection elements according to the invention can thus be used to interconnect several solar cells to thereby form a greater assembly, for example a solar module. The solar module may hereby be encapsulated to be weather-proof.

According to yet another aspect of the present invention, a method of contacting electric components, in particular solar cells, includes the steps of enlarging a surface area of an electric conductor, coating the electric conductor with an electrically conductive coating; thereby producing an electric connection element, and placing the electric connection element onto an electric component with the enlarged surface area facing the electric component to thereby enable the coating to establish a firm connection between the electric conductor and the electric component.

As a result, an especially good bond on the electric component and/or a predefined adhesive force at a slight layer thickness of the coating can be attained.

According to another feature of the present invention, the surface enlargement may be realized by providing the electric conductor with a structuring and/or roughening the surface.

According to another feature of the present invention, an electric conductor may hereby be used having a great length dimension in comparison to the cross section and can be configured, for example, as wire, preferably as flat wire. The electric conductor may suitably be applied along its length dimension onto the electric component. This allows a connection element to interconnect many electric components in one process step.

BRIEF DESCRIPTION OF THE DRAWING

Other features and advantages of the present invention will be more readily apparent upon reading the following description of currently preferred exemplified embodiments of the invention with reference to the accompanying drawing, in which:

FIG. 2b is cross sectional view of the connection element of FIG. 2a;

FIG. 3b is cross sectional view of the connection element of FIG. 3a;

DETAILED DESCRIPTION OF PREFERRED EMBODIMENTS

Figure 1A:
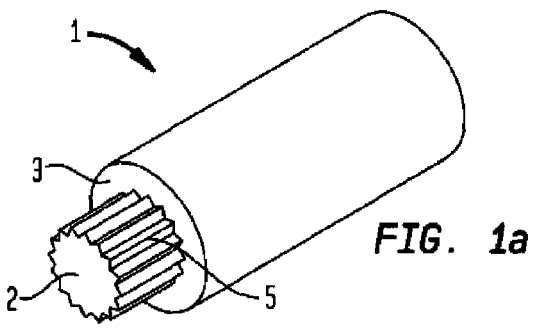
FIG. 1a is a schematic perspective view of a first embodiment of a connection element according to the present invention.

Throughout all the Figures, same or corresponding elements are generally indicated by same reference numerals. These depicted embodiments are to be understood as illustrative of the invention and not as limiting in any way. It should also be understood that the drawings are not necessarily to scale and that the embodiments are sometimes illustrated by graphic symbols, phantom lines, diagrammatic representations and fragmentary views. In certain instances, details which are not necessary for an understanding of the present invention or which render other details difficult to perceive may have been omitted.

This is one of two applications both filed on the same day. Both applications deal with related inventions. They are commonly owned and have the same inventive entity. Both applications are unique, but incorporate the other by reference. Accordingly, the following U.S. patent application, based on U.S. provisional Application No. 60/686,185, filed Jun. 1, 2005, entitled "ELECTRIC CONNECTION ELEMENT" is hereby expressly incorporated by reference.

Figure 1B:
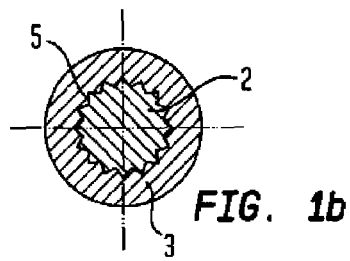
FIG. 1b is cross sectional view of the connection element.

Turning now to the drawing, and in particular to FIGS. 1a, 1b, there is shown an electric connection element, generally designated by reference numeral 1 and including an electric conductor 2 which is substantially circular in shape and forms a core member. The electric conductor 2 is surface-treated to provide a surface enlargement in the form of a structuring and/or rough surface 5 which may be formed, e.g., by rolling, grinding, etching or the like. The effective surface of the electric conductor is thus greater than one without such a process step. The electric conductor 2 is provided all-round with a coating 3 which may contain a solder material for example. As an alternative, the coating 3 may also contain an adhesive.

Figure 2A:
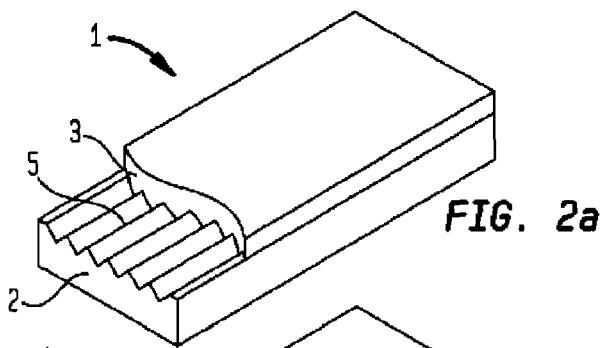
FIG. 2a is a schematic perspective view of a second embodiment of a connection element according to the present invention.
Figure 2B:
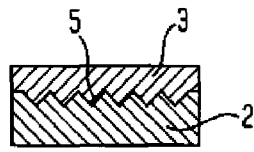

FIGS. 2a, 2b show a second embodiment of an electric connection element 1. Parts corresponding with those in FIG.

1*a* are denoted by identical reference numerals and not explained again. The description below will center on the differences between the embodiments. In this embodiment, the electric conductor 2 of the electric connection element 1 is designed as flat wire so as to have a cross section which non-circular and essentially rectangular in shape. The electric conductor 2 has an upper side which is provided with an electrically conductive coating 3. The upper side of the electric conductor 2, as shown in FIGS. 2*a* and 2*b*, is hereby surface-treated to have a structuring and/or rough surface 5. As an alternative, the lower side of the electric conductor 2, as shown in FIGS. 2*a* and 2*b*, may also have a coating.

Figure 3A:
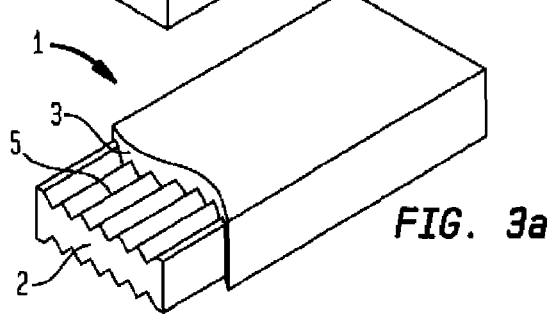
FIG. 3a is a schematic perspective view of a third embodiment of a connection element according to the present invention.
Figure 3B:
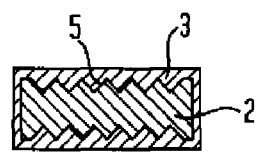

FIGS. 3*a*, 3*b* show a variation of the electric connection element 1 of FIGS. 2*a*, 2*b*. Parts corresponding with those in FIG. 2*a* are again denoted by identical reference numerals and not explained again. The description below will center on the differences between the embodiments. In this embodiment, both the top and bottom sides of the electric conductor have been surface-treated to provide a structuring and/or rough surface 5. As the coating 3 is also applied in cross section over the entire circumference of the electric conductor 2, the electric connection element 1 becomes universally applicable. During production, there is no longer a need to take into account the correct position of the electric connection element 1. In addition, the electric connection element 1 is protected against harmful environmental impacts and corrosion. There is no need however to apply the coating 3 everywhere of even thickness. Rather, more coating material may be applied on one side of the connection element 1. On the opposite side, a layer thickness of the coating 3 may be reduced. Suitably, the layer thickness is greater on the side intended for contacting than on the opposite side where the coating assumes primarily a protective function.

Figure 4:
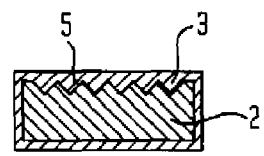
FIG. 4 is a schematic perspective view of a fourth embodiment of a connection element according to the present invention.

FIG. 4 shows another variation of an electric connection element 1 of FIGS. 2*b*, 3*b*. Parts corresponding with those in FIG. 3*b* are denoted by identical reference numerals and not explained again. The description below will center on the differences between the embodiments. In this embodiment, the surface of the electric conductor is here modified, however, only on the side of the electric conductor 2, intended for contacting. The structuring and/or rough surface 5 extends thus in cross section only across a section of the circumference of the electric conductor 2. The coating 3 extends in cross section however over the entire circumference so that the electric conductor 2 is completely enveloped by the coating 3. As a consequence, the electric conductor 2 can be protected against environmental impacts and corrosion at the same time. Also in this case, there is no need to apply the coating everywhere of even thickness. Rather, more coating material may be applied on one side for example. On the opposite side, the layer thickness is reduced for example. In an especially advantageous manner, the layer thickness is greater on the side intended for contacting than on the opposite side where the coating assumes primarily a protective function.

Figure 6:
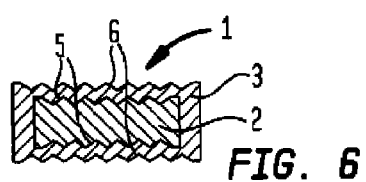
FIG. 6 is a schematic perspective view of a fifth embodiment of a connection element according to the present invention.

Referring now to FIG. 6, there is shown a schematic perspective view of yet another embodiment of a connection element 1 according to the present invention. Corresponding parts are again denoted by identical reference numerals and not explained again. The description below will center on the differences between the embodiments. In this embodiment, the coating 3 has a surface 6 which is also modified, in addition to the treatment of the surface 5 of the electric conductor 2. The surface 6 of the coating 3 is thus also provided with a surface enlargement in the form of a structured and/or rough surface. This is advantageous in conjunction with a heat input into the coating 3 as a consequence of the improved heat and light absorption properties of the coating 3. The surface enlargement of the coating 3 has the advantage during automatic soldering that the surface 6 reflects less light as a result of the dull finish and more light is absorbed as a consequence of the greater surface. Handling is thus significantly improved as more light and heat can be utilized.

Figure 5:
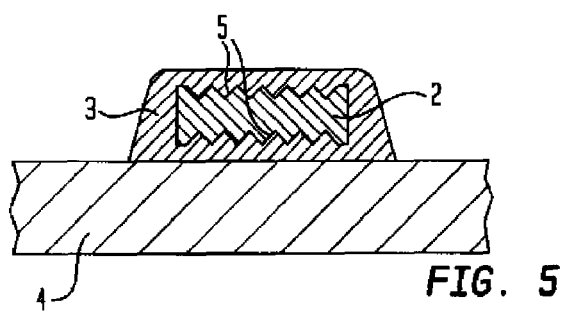
FIG. 5 is a schematic sectional view of a bond between an electric connection element according to the invention and an electric component.

The use of an electric connection element 1 according to the invention will now be described in more detail with reference to FIG. 5. The electric connection element 1, shown here by way of example has a configuration as shown in FIG. 3*b*, and is comprised of the electric conductor 2, designed as flat wire, and the coating 3 which is applied all-round of the conductor 2, whereby the electric conductor 2 is surface-treated on opposites broad sides to provide a structuring and/or rough surface 5. The connecting element 1 is attached to an electric component 4, a solar cell for example, in such a manner that a broadside with the structuring and/or rough surface 5 faces the electric component 4. As the coating 3 envelopes the electric conductor 2 and thus the connection element 1 all-round, the connection element 1 can be rotated into the depicted disposition as well as also in a 180° rotated position. When being made of solderable material, the coating 3 may be heated by infrared light for example and caused to melt. As a result, it bonds with the electric component 4 and ensures a connection between electric conductor 2 and electric component 4 after cooling down.

In all embodiments, the structuring and/or surface 5 of the electric conductor 2 can have any kind of structuring, e.g. grooves in longitudinal and/or transverse direction, flutes in longitudinal and/or transverse direction, grinding marks in longitudinal and/or transverse direction, or the like. The structuring and/or rough surface 5 may have one or more preferred directions or may be configured the same in all directions. The structuring and/or rough surface 5 may be implemented mechanically and/or chemically, e.g. by etching or grinding.

In all embodiments, the coating 3 may itself represent a means for connection of electric conductor 2 and electric component 4. No further connection means such as for example solder or adhesive is then necessary when using the electric connection element 1.

The coating 3 may be made of a solderable material. The increase in the surface area of the electric conductor 2 through incorporation of a structuring and/or rough surface 5 enables a better force fit for the soldered bond between electric conductor 2 and electric component 4. Such soldering may be carried out automatically. Soldering may be executed by means of infrared light. As the coating 3 is made of a solderable material, in particular a solder, e.g. tin, soldering may be carried out without added material. In this case, the solder necessary for a soldered bond is the coating material itself.

As an alternative, the electrically conductive coating 3 may contain an adhesive to effect the connection between the electric conductor 2 and the electric component 4. Also in this case, the increase in surface area through the incorporation of a structuring and/or roughing of the surface 5 of the electric conductor 2 provides an improved force fit between electric conductor 2 and electric component 4.

Regardless of the construction of the connection element 1 according to the present invention, the surface treatment of the electric conductor 2 results in a flat and planar surface configuration. Thus, the surface of the electric connection element 1 is absolutely flat and planar at least in the areas of surface treatment. This is advantageous, when attaching the connection element 1 onto an electric component 4, such as solar cell, because the connection element 1 rests flatly on the electric component 4 and thereby enables the implementation of a secure and reliable bond. When soldered onto a solar cell, in particular on an imprinted silver bus bar providing a counter contact in the soldered bond, the material extends absolutely flat, leading to significant enhancement of the soldering results. In addition, the connection element 1 according to the present invention has a substantially flat and planar surface so that the connection element 1 is much easier to manipulate. In particular when using typical vacuum grippers, such planar objects can be grabbed securely and quickly. Moreover, a wire with planar, flat surface can also be wound onto a coil in a more space-saving and faster manner and with enhanced process safety. The wire, in particular a flat wire, is thus easy to wind onto a coil in layers and easy to unwind. The straight configuration is hereby retained which could conceivably be impaired when the winding is executed in irregular manner. As a result, automation is easier to implement and costs can be decreased.

Figure 7:
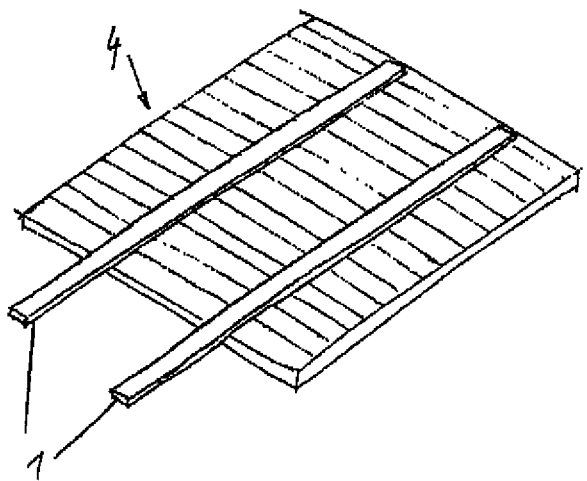
FIG. 7 is a schematic perspective view of a solar cell with two electric connection elements according to the invention attached thereon.

An electric connection element 1 according to the invention is especially applicable as connector for a solar cell 4. As shown in FIG. 7, two electric connection elements 1, respectively designed as flat wire for example, are applied on a surface of the solar cell 4. As an alternative, other described connection elements according to the invention may, of course, be used as well. Using connection elements 1 as connector for a solar cell 4 results in a high strip-off force or tear-off force required to remove the connection element 1 from the solar cell. It is also possible to reduce the coating thickness when the strip-off force or tear-off force is predefined.

Figure 8:
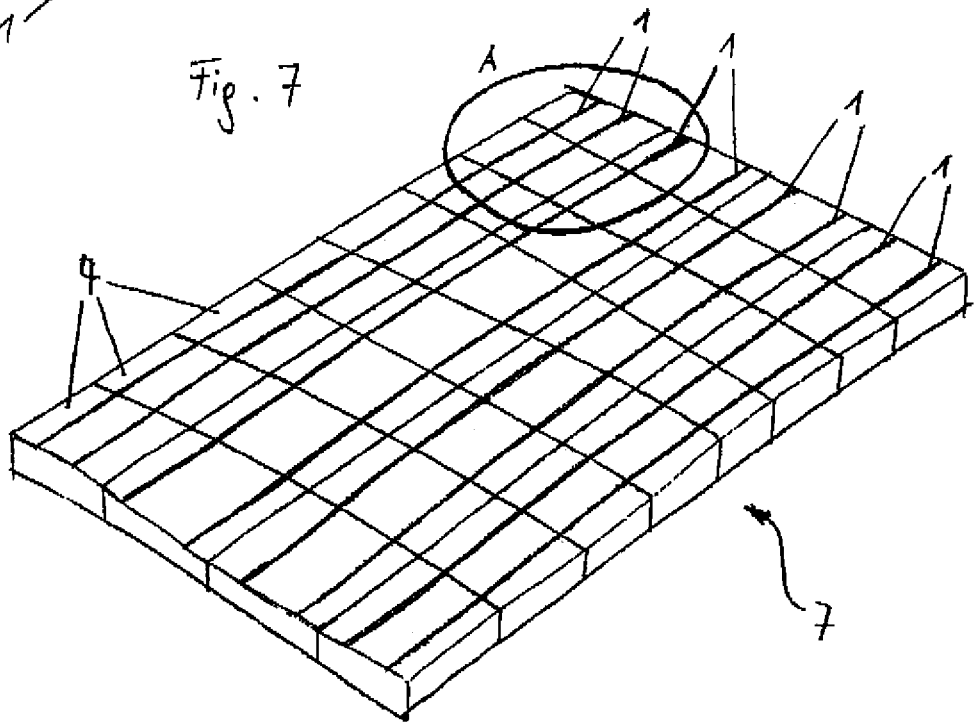
FIG. 8 is a schematic perspective view of a solar module comprised of a plurality of solar cells interconnected by means of electric connection elements according to the invention.

Several solar cells 4 may be interconnected in any suitable fashion to form a solar module 7 by means of the electric connection elements 1. When the connection elements 1 are designed as flat wire, continuous connection bands as shown in FIG. 8 are realized. As an alternative, other described connection elements according to the invention may be used, whereby continuous connection bands are not visible when the connection is realized using punched parts or cut bands for example.

Figure 9:
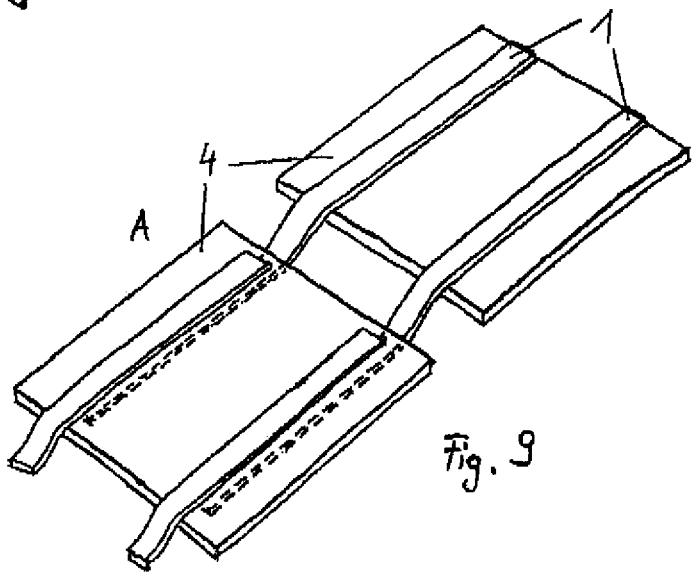
FIG. 9 is a detailed view of an area marked A in FIG. 8 to show the solar module with two solar cells interconnected by means of electric connection elements according to the invention.

A possibility to connect two adjacent solar cells 4 of a solar module 7 is shown in FIG. 9. Each top surface of a solar cell 4 is hereby connected with the bottom side of an adjacent solar cell 4 by connection elements 1 according to the invention.

While the invention has been illustrated and described in connection with currently preferred embodiments shown and described in detail, it is not intended to be limited to the details shown since various modifications and structural changes may be made without departing in any way from the spirit of the present invention. The embodiments were chosen and described in order to best explain the principles of the invention and practical application to thereby enable a person skilled in the art to best utilize the invention and various embodiments with various modifications as are suited to the particular use contemplated.

What is claimed as new and desired to be protected by Letters Patent is set forth in the appended claims and includes equivalents of the elements recited therein:

1. An electric connection element, comprising:
   an electric conductor having a surface configured, at least in regions thereof, with a surface enlargement which is defined by a surface area; and
   an electrically conductive coating applied on the electric conductor for electric connection of the electric conductor with an electric component, said coating being applied across the entire surface area of the surface enlargement to complement a contour of the surface enlargement on an inside surface of the coating while being flat on an outside surface of the coating.

2. The electric connection element of claim 1, wherein the surface enlargement is implemented by structuring the surface and/or roughening the surface.

3. The electric connection element of claim 1, wherein the electrically conductive coating contains a solderable material.

4. The electric connection element of claim 3, wherein the solderable material is a solder.

5. The electric connection element of claim 3, wherein the solderable material is tin.

6. The electric connection element of claim 1, wherein the electrically conductive coating contains an adhesive.

7. The electric connection element of claim 6, wherein the adhesive is a conductive adhesive.

8. The electric connection element of claim 1, wherein the electric conductor is made of metal or metal alloy.

9. The electric connection element of claim 1, wherein the electric conductor is made of copper.

10. The electric connection element of claim 1, wherein the electric conductor is made of copper alloy.

11. The electric connection element of claim 1, wherein the surface enlargement includes a knurling or fluting.

12. The electric connection element of claim 11, wherein the knurling or fluting extends in substantial parallel relationship to a length dimension of the electric conductor.

13. The electric connection element of claim 1, wherein the surface enlargement is made by a grinding process.

14. The electric connection element of claim 1, wherein the surface enlargement is made by an etching process.

15. The electric connection element of claim 1, wherein the surface enlargement extends in cross section only across a region of the electric conductor that is intended for contacting.

16. The electric connection element of claim 1, wherein the surface enlargement extends in cross section over the entire circumference of the electric conductor.

17. The electric connection element of claim 1, wherein the electric conductor is made from a punched part or a cut band.

18. The electric connection element of claim 1, wherein the electric conductor has a length dimension which is greater than a cross section.

19. The electric connection element of claim 1, wherein the electric conductor is designed in the form of a wire.

20. The electric connection element of claim 1, wherein the surface enlargement is made by a grinding process defined by a grinding direction which extends in substantial parallel relationship to a length dimension of the electric conductor.

21. The electric connection element of claim 1, wherein the electric conductor is circular in cross section.

22. The electric connection element of claim 1, wherein the electric conductor has a non-circular shape.

23. The electric connection element of claim 1, wherein the electric conductor is rectangular in cross section.

24. The electric connection element of claim 23, wherein the electric conductor designed as flat wire.

25. The electric connection element of claim 1, wherein the surface enlargement of the electric conductor extends along an entire length of the electric conductor.

26. The electric connection element of claim 1, wherein the coating extends along an entire length of the electric conductor.

27. The electric connection element of claim 1 for application onto a solar cell.

28. The connection element of claim 1 for interconnecting solar cells of a solar module.

* * * * *